(12) United States Patent
Mogelin et al.

(10) Patent No.: US 12,195,324 B2
(45) Date of Patent: Jan. 14, 2025

(54) MICRO-ELECTROMECHANICAL TRANSDUCER WITH SUSPENDED MASS

(71) Applicant: Sonion Nederland B.V., Hoofddorp (NL)

(72) Inventors: Raymond Mogelin, Hoofddorp (NL); Peter Christiaan Post, Hoofddorp (NL)

(73) Assignee: Sonion Nederland B.V., Hoofddorp (NL)

( * ) Notice: Subject to any disclaimer, the term of this patent is extended or adjusted under 35 U.S.C. 154(b) by 562 days.

(21) Appl. No.: 17/512,999

(22) Filed: Oct. 28, 2021

(65) Prior Publication Data

US 2022/0127135 A1 Apr. 28, 2022

(30) Foreign Application Priority Data

Oct. 28, 2020 (EP) ..................................... 20204289

(51) Int. Cl.
*B81B 3/00* (2006.01)
*H04R 1/10* (2006.01)
*H04R 25/00* (2006.01)

(52) U.S. Cl.
CPC ............ *B81B 3/0021* (2013.01); *H04R 1/10* (2013.01); *H04R 25/65* (2013.01); *B81B 2201/0257* (2013.01); *B81B 2201/0264* (2013.01); *H04R 2201/003* (2013.01)

(58) Field of Classification Search
None
See application file for complete search history.

(56) References Cited

U.S. PATENT DOCUMENTS

| 2015/0131820 A1* | 5/2015 | Veneri | ...................... H04R 3/00 |
| | | | 381/174 |
| 2022/0169499 A1* | 6/2022 | Lafort | ...................... B06B 1/12 |

FOREIGN PATENT DOCUMENTS

| EP | 3279621 A1 | 2/2018 |
| EP | 3342749 A2 | 7/2018 |
| EP | 3342749 A3 | 9/2018 |
| EP | 3467457 A2 | 4/2019 |
| EP | 3467457 A3 | 9/2019 |

* cited by examiner

*Primary Examiner* — Michael Lebentritt
(74) *Attorney, Agent, or Firm* — Harness, Dickey & Pierce, P.L.C.

(57) ABSTRACT

The present invention relates to a micro-electromechanical transducer comprising a pressure detection arrangement and a sub-assembly adapted to cooperate with the pressure detection arrangement via a coupling volume, said sub-assembly comprising one or more moveable masses, a suspension member suspending a number of moveable masses, wherein the coupling volume is at least partly defined by the suspension member, and wherein the coupling volume is acoustically connected to an interior volume of the pressure detection arrangement, and wherein the suspension member comprises a viscoelastic material with a predetermined viscous and sealant behaviour in order to dampen one or more resonance peaks of the micro-electromechanical transducer and acoustically seal the coupling volume. The present invention further relates to a hearing device comprising such a micro-electromechanical transducer.

25 Claims, 3 Drawing Sheets

MICRO-ELECTROMECHANICAL TRANSDUCER WITH SUSPENDED MASS

RELATED APPLICATIONS

This application claims priority to European Patent Application No. 20204289.1 filed on Oct. 28, 2020, the entire contents of which are incorporated herein by reference.

FIELD OF THE INVENTION

The present invention relates to a micro-electromechanical transducer comprising a pressure detection arrangement, such as a MEMS microphone, and a sub-assembly adapted to cooperate with the pressure detection arrangement via a coupling volume, said sub-assembly comprising one or more moveable masses and a suspension member suspending a number of moveable masses. According to the present invention the coupling volume is at least partly defined by the suspension member. Moreover, the coupling volume is acoustically connected to an interior volume of the pressure detection arrangement.

BACKGROUND OF THE INVENTION

For voice pickup in relation to bone conduction, a vibration sensor having high sensitivity and low noise in the speech frequency band is required. In order to get high sensitivity, S, the resonance frequency, $f_{pk}$, of the vibration sensor must be low because $s \propto 1/f_{pk}$. In order to get a low noise, $a_n$, the moveable mass, m, of the vibration sensor should be large because $a_n \propto \sqrt{f_{pk}/(Q \cdot m)}$. However, large moveable masses are not compatible with compact vibration sensors utilizing MEMS technology.

Several performance related issues need to be dealt with when designing vibration sensors utilizing moveable masses. Firstly, a moveable mass must be held in place, i.e. the suspension element suspending the moveable mass should have a certain mechanical stiffness. Secondly, the displacement of the moveable mass should generate a pressure change whereby one or more sealings between air volumes on both sides of the moveable mass is/are needed. Thirdly, the movements of the moveable mass should be damped using for example the viscoelastic properties of a suspension element and/or a sealing material as suggested in for example EP 3 279 621 A2, EP 3 467 457 A2 and EP 3 342 749 A2.

However, the solutions suggested in EP 3 279 621 A2, EP 3 467 457 A2 and EP 3 342 749 A2 all suffer from a number of disadvantages, including 1) plastic deformation of the suspension element in case of extreme mechanical shock, and 2) that the total mechanical stiffness of the pressure generating arrangement is dominated by the suspension element. In relation to plastic deformation this leads to a permanent displacement of the moveable mass—this affects the acoustically coupled volumes. Moreover, plastic deformation affects the acoustic coupling between a pressure generating arrangement (suspended moveable mass) and a pressure detection arrangement (MEMS microphone). As to the total mechanical stiffness, the contribution to the mechanical stiffness from the sealing and damping material must be small—this limits the choice of materials for sealing and damping in an undesired way.

Thus, there seems to be a need for solving the above-mentioned problems—in particular in relation to compact vibration sensors for use in for example bone conduction related applications.

It may therefore be seen as an object of embodiments of the present invention to provide a micro-electromechanical transducer with high sensitivity and low noise in particular in the speech frequency band.

It may be seen as a further object of embodiments of the present invention to provide a micro-electromechanical transducer that requires a minimum of process steps during manufacturing.

It may be seen as an even further object of embodiments of the present invention to provide a micro-electromechanical transducer comprising a simple and integrated arrangement with predetermined suspension, sealing and damping properties.

DESCRIPTION OF THE INVENTION

The above-mentioned objects are complied with by providing, in a first aspect, a micro-electromechanical transducer comprising a pressure detection arrangement and a sub-assembly adapted to cooperate with the pressure detection arrangement via a coupling volume, said sub-assembly comprising
  one or more moveable masses, and
  a suspension member suspending a number of moveable masses,
wherein the coupling volume is at least partly defined by the suspension member, and wherein the coupling volume is acoustically connected to an interior volume of the pressure detection arrangement, and wherein
the suspension member comprises a viscoelastic material with a predetermined viscous and sealant behaviour in order to dampen one or more resonance peaks of the micro-electromechanical transducer and acoustically seal the coupling volume.

Preferably, the pressure detection arrangement is a MEMS microphone. The present invention is advantageous in that the sub-assembly forms part of a pressure generating arrangement for generating pressure changes, whereas the MEMS microphone forms part of a pressure detection arrangement for detecting pressure changes—preferably the pressure changes generated by the pressure generating arrangement, i.e. the sub-assembly.

It is moreover advantageous that the moveable mass that generates the pressure changes is now separated from the pressure detection arrangement/MEMS microphone. Instead, the moveable mass forms part of the pressure generating arrangement, i.e. the sub-assembly, where it is acoustically connected/coupled to the pressure detecting arrangement/MEMS microphone via the coupling volume and, preferably, an opening in an exterior surface of the pressure detection arrangement/MEMS microphone. Thus, the coupling volume is preferably acoustically connected to the interior volume of the pressure detection arrangement via an opening in an exterior surface of the pressure detection arrangement/MEMS microphone. Preferably, the pressure detection arrangement/MEMS microphone comprises a housing/casing encapsulating the components of the pressure detection arrangement/MEMS microphone. In the present context the term "exterior surface" should be understood as an outer surface of this housing/casing of the pressure detection arrangement/MEMS microphone.

The term "adapted to cooperate with" should thus, in the present context, be understood as "acoustically connected/coupled to". It should also be understood that the sub-assembly may be adapted to cooperate with the pressure detection arrangement by other means than the coupling volume—such other means may involve a venting opening between respective back volumes as disclosed below.

As it will be discussed in further detail below, the interior volume of the MEMS microphone, to which the coupling volume is acoustically connected, preferably involves a front volume of a MEMS cartridge of the MEMS microphone. The MEMS microphone further comprises a signal processor for processing electrical signals generated by the MEMS cartridge. Preferably, the exterior surface of the MEMS microphone is formed by an exterior surface of a printed circuit board (PCB). The same PCB also comprises an inner surface to which the MEMS cartridge and the signal processor preferably are secured.

Preferably, the micro-electromechanical transducer of the present invention is a vibration sensor, such as a vibration sensor suitable for being used in bone conduction related applications.

In terms of functionality it is advantageous that the suspension member combines three functionalities in only a single element—namely suspension, sealing and damping in that the viscoelastic properties of the suspension member determines the mechanical stiffness and damping of the pressure generating arrangement, i.e. the suspension member and the one or more moveable masses.

The micro-electromechanical transducer of the present invention is advantageous in that the suspension member is preferably manufactured of a viscoelastic material having essentially no plastic deformation. Preferably, the viscoelastic material is thermosetting elastomer with a low Young's modulus and a high viscosity, such as a silicone rubber As it will be discussed in further details below the suspension member may be moulded using a moulding manufacturing process, or it may be implemented as a film suspended across a spacer arrangement. The film may be a single layer film or, alternatively, a multilayer film.

Figure 1A:
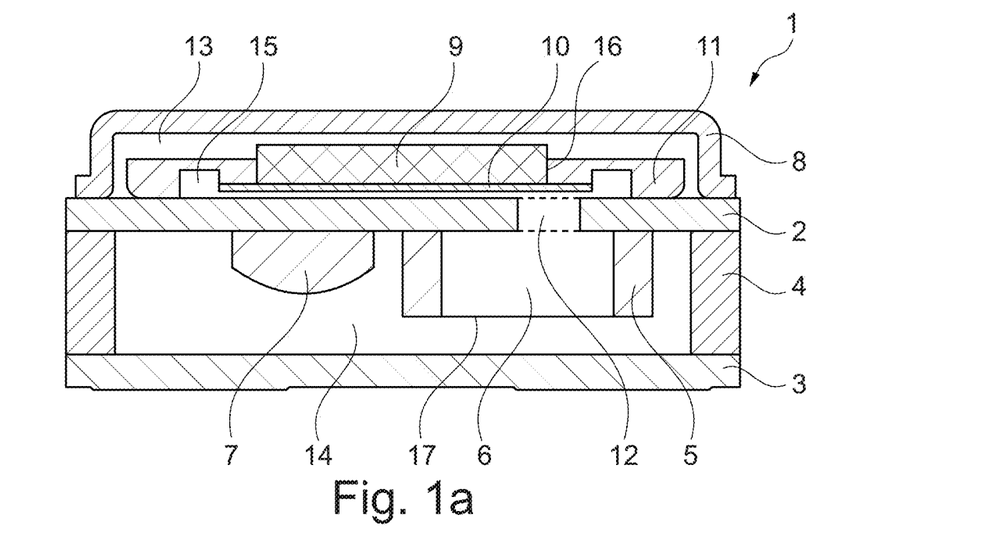
FIGS. 1a and 1b show cross-sectional views of a first embodiment of the present invention where the suspension member has an integrated spacer.
Figure 1B:
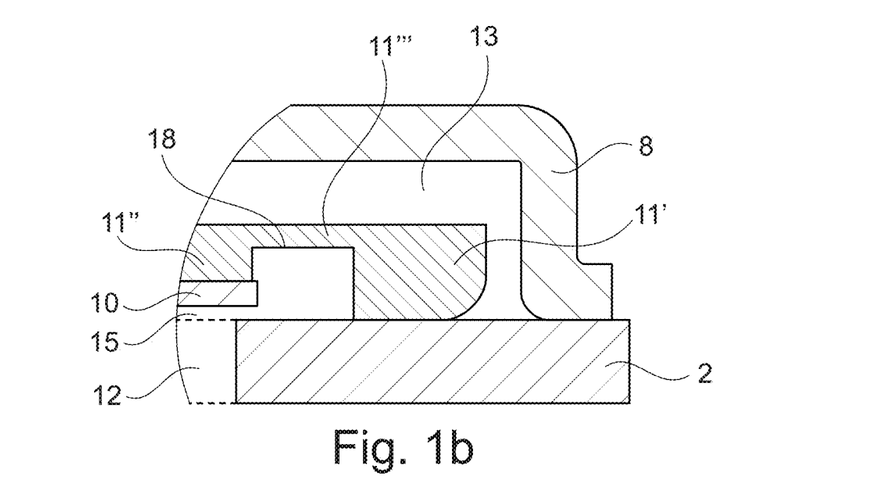

It is moreover advantageous that the suspension member of the micro-electromechanical transducer of the present invention offers a better ratio between damping and stiffness as well as better tolerances during manufacturing—the latter allowing manufacturing of smaller transducers. As it will be discussed in relation to FIG. 1 a moulded suspension member is advantageous in that it facilitates integration of additional elements, such as one or more spacers that determine the dimensions of one or more volumes, such as a coupling volume and/or a back volume of the sub-assembly. With respect to a suspension member being implemented as a suspended film of, for example, silicone rubber it is advantageous that silicone rubber is adhesive-less thus facilitating an adhesive-less micro-electromechanical transducer. Moreover, the stiffness of the suspension member is not affected by bleed-out of adhesive, and the dimensions are not affected by thickness of an adhesive layer.

In terms of implementation the suspension member may, in one embodiment, form a surround encircling a support structure secured thereto, and wherein one or more moveable masses is/are secured to the support structure. In the present context the term "surround" is to be understood as a suspension member that in an unbroken, sealing and encircling manner surrounds the support structure secured thereto.

Preferably, the suspension member comprises, in a cross-sectional profile, an inner portion having an inner thickness and an outer portion having an outer thickness, wherein the outer thickness is greater than the inner thickness. The fact that the thickness of the outer portion of the suspension member is greater is advantageous in that the outer portion may then be considered having an integrated spacer incorporated therein. For this reason the outer portion of the suspension member is preferably secured to the exterior surface of the MEMS microphone. The thickness of the outer portion of the suspension member thus sets the volume of the coupling volume.

It is moreover advantageous that an indentation is formed between the inner and outer portions of the suspension member. At the position of the indentation, i.e. between the inner and outer portions, the suspension member preferably has its thinnest portion, i.e. it smallest thickness. Due to the reduced thickness the viscoelastic properties of the suspension member are primarily determined by this thinnest portion.

In another embodiment the suspension member comprises a film of a viscoelastic material suspended between spacer portions, wherein one or more moveable masses is/are secured to either one surface or both surfaces of the suspended film. The spacer portions are, directly or indirectly, secured to the exterior surface of the MEMS microphone. Preferably, two essentially identical moveable masses are secured to opposing sides of the suspended film using appropriate means, such as appropriate adhesives.

In terms of implementation the spacer portions may constitute at least part of a peripheral rim of a spacer structure further comprising a central indentation encircled by the peripheral rim. Thus, the spacer structure may be cup-shaped where the central indentation is secured to the exterior surface of the MEMS microphone using appropriate means, such as an appropriate adhesive. The height of the spacer structure sets the volume of the coupling volume. In order to acoustically connect the coupling volume to the interior volume of the MEMS microphone, the spacer structure preferably comprises a ventilation opening aligned with the opening in the exterior surface of the MEMS microphone.

In another implementation the spacer portions may form a peripheral spacer secured to, or forming part of, the exterior surface of the MEMS microphone. Thus, the peripheral spacer may be a discrete element secured to the exterior surface of the MEMS microphone using appropriate means, or the peripheral spacer may form an integral part of the exterior surface of the MEMS microphone. Again, the height of the peripheral spacer sets the volume of the coupling volume.

Independent of the implementation of the spacer or the outer portion of the suspension member, the exterior surface of the MEMS microphone may comprise a further opening, said further opening acoustically connecting a back volume of the sub-assembly and a back volume of the MEMS microphone. Even further, the suspension member may comprise a ventilation opening for venting the coupling volume. Such a venting opening in the suspension member may acoustically connect the coupling volume with a back volume of the sub-assembly. Incorporating a venting opening in the suspension member is advantageous in that it eliminates the need for an additional and discrete aluminum disk with a venting opening arranged therein.

Preferably, the sub-assembly further comprises a housing secured to the exterior surface of the MEMS microphone, the housing setting the outer boundaries of a sub-assembly back volume. The housing of the sub-assembly is moreover advantageous in that during undesired shock events, the movements of the one or more moveable masses is/are confined by the housing of the sub-assembly on one side and the exterior surface of the MEMS microphone on the other side. Thus, the maximum travel of the one or more moveable masses is/are limited.

As already mentioned the MEMS microphone preferably comprises a pressure sensing element, such as a MEMS cartridge, and a signal processor for processing electrical signals from the pressure sensing element.

In relation to the suspension member the viscoelastic material forming the suspension member is preferably selected from a group of thermosetting elastomers having a low Young's modulus and a high viscosity, such as silicone rubber.

In a second aspect, the present invention relates to a hearing device comprising a micro-electromechanical transducer according to the first aspect. Preferably, the hearing device of the second aspect is a hearing aid, a hearable, an earbud or a similar device.

In general, the various aspects of the invention may be combined and coupled in any way possible within the scope of the invention. These and other aspects, features and/or advantages of the invention will be apparent from and elucidated with reference to the embodiments described hereinafter.

BRIEF DESCRIPTION OF THE DRAWINGS

The present invention will now be described in further details with reference to the accompanying figures where.

DETAILED DESCRIPTION OF THE INVENTION

In general, the present invention relates to a micro-electromechanical transducer, such as a vibration sensor, comprising a MEMS microphone and a sub-assembly secured thereto. The role of the sub-assembly is to generate a pressure change in a coupling volume when the micro-electromechanical transducer is exposed to vibrations, whereas the role of the MEMS microphone is to detect and convert this pressure change to an electrical output signal. Thus, according to the present invention, a sub-assembly forms part of a pressure generating arrangement for generating pressure changes, whereas a MEMS microphone forms part of a pressure detection arrangement for detecting pressure changes—in particular the pressure changes generated by the sub-assembly.

FIG. 1a shows a first embodiment of a vibration sensor 1 comprising a MEMS microphone and a sub-assembly arranged on top of the MEMS microphone. As it will be discussed in further details below the MEMS microphone comprises a MEMS cartridge 5 (pressure sensing element) and a signal processor 7 for processing electrical signals generated by the MEMS cartridge 5 when exposed to vibrations. The MEMS cartridge 5 of the MEMS microphone may apply various detection schemes, including piezo, charged plate capacitor etc. The signal processor 7 of the MEMS microphone may be operating in the analog or digital domain applying any digital coding scheme.

The MEMS microphone further comprises a housing having a top PCB (Printed Circuit Board) 2 and a bottom PCB 3 on which electrodes (now shown) for electrically connecting the vibration sensor 1 are provided. The electrodes may be in the form of solder pads. A wall portion 4 is provided between the top PCB 2 and the bottom PCB 3, and an acoustical opening 12 is provided in the top PCB 2. As it will be discussed in further details below the acoustical opening 12 acoustically connects the coupling volume 15 between the sub-assembly and the MEMS microphone to the front volume 6 of the MEMS cartridge 5.

The MEMS cartridge 5 of the MEMS microphone comprises a membrane 17 and a front volume 6. The MEMS microphone further comprises a back volume 14 within which back volume 14 the signal processor 7 is arranged. As addressed above, the sub-assembly is arranged on top of the MEMS microphone. As seen in FIG. 1a the sub-assembly is secured to an exterior surface of the top PCB 2, whereas the MEMS cartridge 5 and the signal processor 7 are secured to an inner surface of the same PCB, i.e. the top PCB 2.

The sub-assembly comprises a housing 8, a suspension member 11, a support 10 and a moveable mass 9 secured to the support 10. The suspension member 11 may comprise an acoustical opening (not shown) so that the coupling volume 15 and the back volume 13 are connected.

When the entire vibration sensor 1 is exposed to vibrations, the moveable mass 9 and the support 10 move relative to the top PCB 2 and creates a pressure change in the coupling volume 15. This pressure change is detected by the MEMS microphone via the opening 12, and the MEMS microphone converts the detected pressure change to an electrical output signal.

The suspension member 11 is preferably manufactured, i.e. moulded, using a viscoelastic material, such as silicone rubber, having essentially no plastic deformation. It is advantageous that the suspension member 11 combines three functionalities in only a single element—namely suspension, sealing and damping in that the viscoelastic properties of the suspension member 11 determines the mechanical stiffness and damping of the pressure generating arrangement, i.e. the suspension member 11, the support 10 and the moveable mass 9.

The housing 8 of the sub-assembly can be made of any suitable material as long as it seals the inside of the sub-assembly completely. Preferably, a thin metal shield is applied. A small hole in the housing 8 with a low-frequency roll-off below 10 Hz may be allowed as such a small hole does not introduce acoustic noise.

The mass of the moveable mass 9 is preferable around 4 mg. It is estimated that the practical minimum mass would be around 0.004 mg as this would increase the noise level with 30 dB. Similarly, a mass of 0.04 mg would increase the noise level with 20 dB, and a mass of 0.4 mg would increase the noise level with 10 dB. Thus, the higher the mass of the moveable mass 9 the lower is the effect of the thermal movement noise of the vibration sensor. As seen in FIG. 1a the moveable mass 9 abuts the suspension member 11 at the interface 16. Thus, although being secured to the support 10 the suspension member 11 also supports the moveable mass 9.

Still referring to FIG. 1a, a small coupling volume 15 exists between the suspension member 11, the support 10 and the upper side of the top PCB 2. This coupling volume 15 should preferably be as small as possible. Preferably the coupling volume 15 is smaller than 5 mm$^3$, such as smaller than 2 mm$^3$, such as smaller than 1 mm$^3$, such as smaller than 0.75 mm$^3$, such as smaller than 0.5 mm$^3$, such as smaller than 0.25 mm$^3$, such as smaller than 0.1 mm$^3$.

Referring now to FIG. 1b a close-up of the suspension member 11 is depicted. As seen in FIG. 1b the suspension member comprises, in a cross-section view, three portions— namely an outer portion 11', an inner portion 11" and a centre portion 11'" where an indentation 18 separates the inner and outer portions 11', 11". As also depicted in FIG. 1b (and FIG. 1a) the thickness of the outer portion 11' is greater than the thickness of the inner portion 11". This allows that the support 10 can be secured to the inner portion 11" of the suspension member and that the coupling volume 15 can be formed below the support 10. The outer portion 11' of the suspension member is secured to the exterior surface of the top PCB 2 of the MEMS microphone. Thus, the volume of the coupling volume 15 is determined by the thickness of the outer portion 11' of the suspension member. The viscoelastic properties of the suspension member are primarily determined by the centre portion 11'" due to its reduced thickness. Preferably, the outer portion 11', the inner portion 11" and the centre portion 11'" of the suspension member form a one-piece moulded structure of silicone or rubber.

Preferably, the viscoelastic material of the suspension member 11 should be able to withstand typical reflow temperatures as reflow soldering is an important issue in relation to modern manufacturing processes. In order to comply with modern reflow soldering demands the viscoelastic material should be capable of withstanding temperatures of at least 80° C., such as at least 100° C., such as at least 120° C., such as at least 150° C., such as at least 200° C., such as at least 250° C., such as at least 300° C., such as at least 350° C., such as at least 400° C.

The total area of the suspension member 11 and the support 10 should be as large as possible, and preferably larger than 0.5 mm$^2$, such as larger than 1 mm$^2$, such as larger than 2 mm$^2$, such as larger than 4 mm$^2$, such as larger than 6 mm$^2$, such as larger than 8 mm$^2$, such as larger than 10 mm$^2$. A large total area is advantageous as this requires a smaller amplitude of the movement of the moveable mass 9 in order to reach certain volume displacement and thereby sensitivity.

Optionally, the back volume 13 above the suspension member 11 and the moveable mass 9 may be acoustically connected to the back volume 14 of the MEMS microphone. This acoustical connection (not shown) may be provided by various means, such as a further opening in the top PCB 2 as it will be discussed in detail in relation to FIG. 3.

Figure 2A:
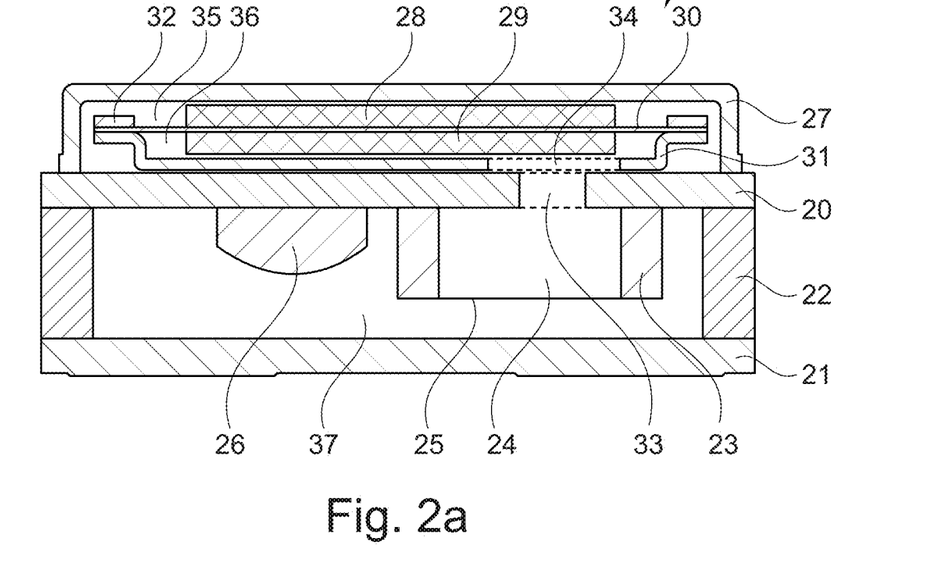
FIGS. 2a and 2b show cross-sectional view of a second embodiment of the present invention where the suspension member is a film of a viscoelastic material suspended between spacer portions.

Turning now to FIG. 2a, a second embodiment of a vibration sensor 19 is depicted. Similar to the embodiment shown in FIG. 1a, the vibration sensor depicted in FIG. 2a also comprises a sub-assembly arranged on top of a MEMS microphone comprising a MEMS cartridge 23 (pressure sensing element) and a signal processor 26 for processing electrical signals generated by the MEMS cartridge 23 when the vibration sensor is exposed to vibrations. The MEMS cartridge 23 of the MEMS microphone may again apply various detection schemes, including piezo, charged plate capacitor etc., and the signal processor 26 may be operating in the analog or digital domain applying any digital coding scheme.

The MEMS microphone again comprises a housing having a top PCB 20 and a bottom PCB 21 on which electrodes (now shown) for electrically connecting the vibration sensor 19 are provided. The electrodes may be in the form of solder pads. A wall portion 22 is provided between the top PCB 20 and the bottom PCB 21, and an acoustical opening 33 is provided in the top PCB 20. The acoustical opening 33 acoustically connects the coupling volume 36 and the front volume 24 of the MEMS cartridge.

Similar to the discussion in relation to FIG. 1a the MEMS cartridge 23 of the MEMS microphone comprises a membrane 25 and a front volume 24. The MEMS microphone further comprises a back volume 37 within which back volume 37 the signal processor 26 is arranged.

As previously addressed the sub-assembly is secured to the top PCB 20 of the MEMS microphone. As seen in FIG. 2a the sub-assembly is secured to an exterior surface of the top PCB 20, whereas the MEMS cartridge 23 and the signal processor 26 are secured to an inner surface of the same PCB, i.e. the top PCB 20.

The sub-assembly comprises a housing 27, a suspension member 30 in the form of a film and moveable masses 28, 29 secured to opposing surfaces of the suspension member 30. The suspension member 30 may be a single layer film or a multilayer film, and it may comprise an acoustical opening (not shown) so that the coupling volume 36 and the back volume 35 are acoustically connected.

When the entire vibration sensor 19 is exposed to vibrations, the moveable masses 28, 29 move relative to the cup-shaped spacer structure 31, and the suspension member 30 will act as a membrane that creates a pressure change in the coupling volume 36 in response to the vibrations. This pressure change is detected by the MEMS microphone via the openings 33, 34, and the MEMS microphone converts the detected pressure change to an electrical output signal.

The suspension member 30 is preferably manufactured of a viscoelastic material, and the suspension member 30 preferably takes the form of a silicone rubber film having essentially no plastic deformation. It is again advantageous that the suspension member 30 combines three functionalities in only a single element—namely suspension, sealing and damping in that the viscoelastic properties of the suspension member 30 determines the mechanical stiffness and damping of the pressure generating arrangement, i.e. the suspension member 30 in combination with the moveable masses 28, 29. It should however be noted that a single moveable mass may replace the two moveable masses 28, 29 depicted in FIG. 2a. This single moveable mass may be secured to either the upper or lower surface of the suspension member 30.

As depicted in FIG. 2a the suspension member 30 is suspended across a cup-shaped spacer structure 31 having peripheral rim to which the suspension member 30 is secured. An additional rim 32 is arranged on top of the suspension member 30. The cup-shaped spacer structure 31 comprises an opening 34 which is aligned with the opening 33 in the top PCB 20 so that coupling volume 36 is acoustically connected to the front volume 24 of the MEMS cartridge.

The housing 27 of the sub-assembly can be made of any suitable material as long as it seals the inside of the sub-assembly completely. Preferably, a thin metal shield is applied. A small hole in the housing 27 with a low-frequency roll-off below 10 Hz may be allowed as such a small hole does not introduce acoustic noise.

The total mass of the moveable masses 28, 29 is preferable around 4 mg. As previously mentioned it is estimated that the practical minimum mass would be around 0.004 mg as this would increase the noise level with 30 dB. Similarly, a mass of 0.04 mg would increase the noise level with 20 dB, and a mass of 0.4 mg would increase the noise level with 10 dB. Thus, the higher the mass of the moveable masses 28, 29 the lower is the effect of the thermal movement noise of the vibration sensor.

Still referring to FIG. 2a a small coupling volume 36 exists between the suspension member 30, the moveable mass 29 and a bottom portion of the cup-shaped spacer structure 31. This coupling volume 36 should preferably be as small as possible, and preferably smaller than 5 mm$^3$, such as smaller than 2 mm$^3$, such as smaller than 1 mm$^3$, such as smaller than 0.75 mm$^3$, such as smaller than 0.5 mm$^3$, such as smaller than 0.25 mm$^3$, such as smaller than 0.1 mm$^3$.

Figure 2B:
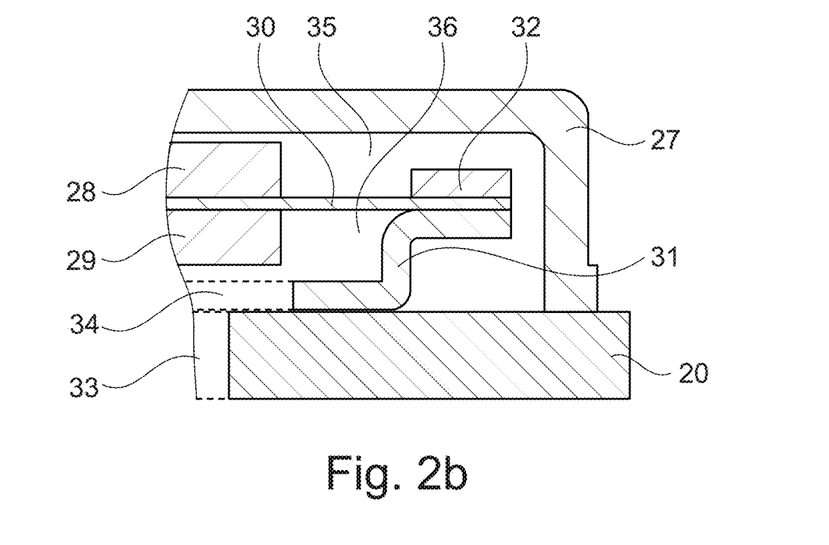

Referring now to FIG. 2b a close-up of the film based suspension member 30 is depicted. As seen in FIG. 2b the moveable masses 28, 29 are secured to opposing surfaces of the suspension member 30. As already addressed an opening 34 in the cup-shaped spacer structure 31 is aligned with the opening 33 in the top PCB 20 of the MEMS microphone thereby the coupling volume 36 becomes acoustically connected to the front volume 24 of the MEMS cartridge 23. The suspension member 30 may, as already mentioned, be constituted by a single viscoelastic layer or, alternative, it may be constituted by multiple viscoelastic layers.

Preferably, the viscoelastic material of the suspension member 30 should be able to withstand typical reflow temperatures as reflow soldering is an important issue in relation to modern manufacturing processes. In order to comply with modern reflow soldering demands the viscoelastic material should be capable of withstanding temperatures of at least 80° C., such as at least 100° C., such as at least 120° C., such as at least 150° C., such as at least 200° C., such as at least 250° C., such as at least 300° C., such as at least 350° C., such as at least 400° C.

The total area of the suspension member 30 should be as large as possible, and preferably larger than 0.5 mm$^2$, such as larger than 1 mm$^2$, such as larger than 2 mm$^2$, such as larger than 4 mm$^2$, such as larger than 6 mm$^2$, such as larger than 8 mm$^2$, such as larger than 10 mm$^2$. A large total area is advantageous as this requires a smaller amplitude of the movement of the moveable masses 28, 29 in order to reach certain volume displacement and thereby sensitivity.

Similar to the embodiment depicted in FIG. 1a the back volume 35 above the suspension member 30 and the moveable masses 28, 29 may be acoustically connected to the back volume 37 of the MEMS microphone. This acoustical connection (not shown) may be provided by various means, such as a further opening in the top PCB 20 as it will be discussed in relation to FIG. 3.

Figure 3:
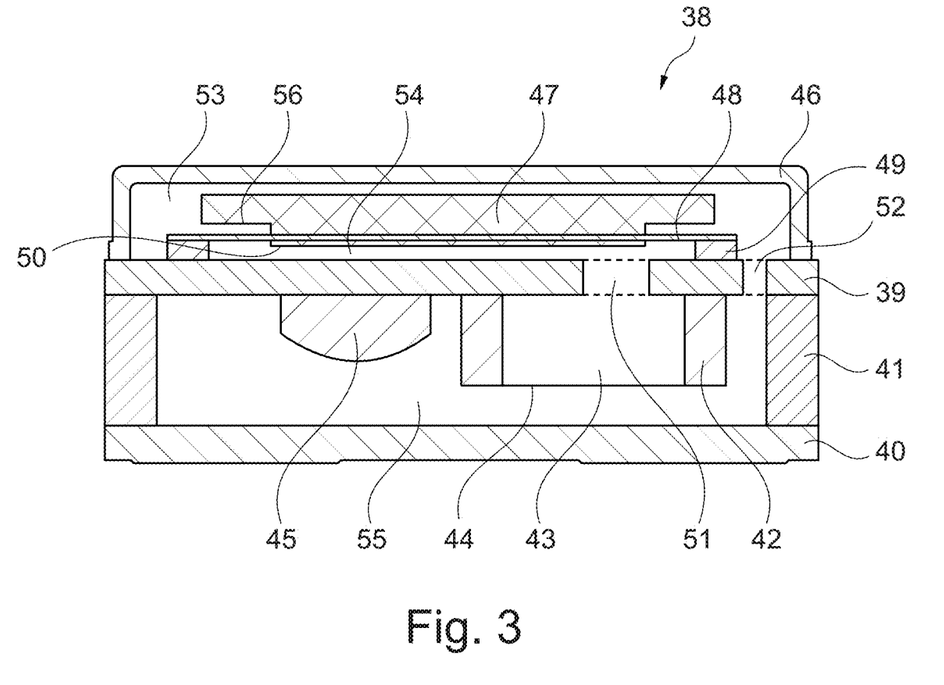
FIG. 3 shows a cross-sectional view of a third embodiment of the present invention where the suspension member is a suspended film of a viscoelastic material, and where back volumes of the MEMS microphone and the sub-assembly are acoustically connected.

Turning now to FIG. 3 a third embodiment of a vibration sensor 38 is depicted. Similar to the previous embodiments the vibration sensor depicted in FIG. 3 comprises a sub-assembly arranged on top of a MEMS microphone comprising a MEMS cartridge 42 (pressure sensing element) and a signal processor 45 for processing electrical signals generated by the MEMS cartridge 42. The MEMS cartridge 42 of the MEMS microphone may again apply various detection schemes, including piezo, charged plate capacitor etc., and the signal processor 45 may be operating in the analog or digital domain applying any digital coding scheme.

Again, the MEMS microphone comprises a housing having a top PCB 39 and a bottom PCB 40 on which electrodes (now shown) for electrically connecting the vibration sensor 38 are provided. The electrodes may be in the form of solder pads. A wall portion 41 is provided between the top PCB 39 and the bottom PCB 40, and acoustical openings 51, 52 are provided in the top PCB 39. The acoustical opening 51 acoustically connects the coupling volume 54 and the front volume 43 of the MEMS cartridge 42, whereas the opening 52 acoustically connects the back volume 53 of the sub-assembly and the back volume 55 of the MEMS microphone.

Similar to the previous discussions the MEMS cartridge 42 of the MEMS microphone comprises a membrane 44 and a front volume 43. The signal processor 45 is arranged in the back volume 55 of the MEMS microphone. The sub-assembly is secured to an exterior surface of the top PCB 39 of the MEMS microphone, and it comprises a housing 46, a suspension member 48 in the form of a suspended film and a moveable mass 47 secured to the suspension member 48. The suspension member 48 may be a single layer film or a multilayer film, and it may comprise an acoustical opening (not shown) so that the coupling volume 54 and the back volume 53 are acoustically connected. The MEMS cartridge 42 and the signal processor 45 are secured to an inner surface of the top PCB 39.

When the vibration sensor 38 is exposed to vibrations, the moveable mass 47 move relative to the spacer 49, and the suspension member 48 (suspended film) will act as a membrane that creates a pressure change in the coupling volume 54. This pressure change is detected by the MEMS microphone via opening 51, and the MEMS microphone converts the detected pressure change to an electrical output signal.

The suspension member 48 is manufactured of a viscoelastic material, and the suspension member 48 preferably takes the form of a silicone rubber film having essentially no plastic deformation. It is again advantageous that the suspension member 48 combines three functionalities in only a single element—namely suspension, sealing and damping in that the viscoelastic properties of the suspension member 48 determines the mechanical stiffness and damping of the pressure generating arrangement, i.e. the suspension member 48 in combination with the moveable mass 47.

An anti-stiction layer 50 is provided to the lower surface of the suspension member 48 in order to prevent that the suspension member 48 sticks to the exterior surface of the top PCB 39 at large deflections.

The suspension member 48 may, as already mentioned, be constituted by a single viscoelastic layer or, alternatively, it may be constituted by multiple viscoelastic layers.

Preferably, the viscoelastic material of the suspension member 48 should be able to withstand typical reflow temperatures, i.e. the viscoelastic material should be capable of withstanding temperatures of at least 80° C., such as at least 100° C., such as at least 120° C., such as at least 150° C., such as at least 200° C., such as at least 250° C., such as at least 300° C., such as at least 350° C., such as at least 400° C.

As depicted in FIG. 3 the suspension member 48 is distanced from the top PCB 39 using a spacer 49 which may be a discrete spacer or a spacer forming an integral part of the top PCB 39. The housing 46 of the sub-assembly can be made of any suitable material as long as it seals the inside of the sub-assembly completely. Preferably, a thin metal shield is applied. A small hole in the housing 46 with a low-frequency roll-off below 10 Hz may be allowed as such a small hole does not introduce acoustic noise.

The mass of the moveable mass 47 is preferable around 4 mg. As previously mentioned it is estimated that the practical minimum mass would be around 0.004 mg as this would increase the noise level with 30 dB. Similarly, a mass of 0.04 mg would increase the noise level with 20 dB, and a mass of 0.4 mg would increase the noise level with 10 dB. Thus, the higher the mass of the moveable mass 47 the lower is the effect of the thermal movement noise of the vibration sensor.

Still referring to FIG. 3 a small coupling volume 54 exists between the suspension member 48 and the top PCB 39. This coupling volume should be as small as possible, and preferably smaller than 5 mm$^3$, such as smaller than 2 mm$^3$, such as smaller than 1 mm$^3$, such as smaller than 0.75 mm$^3$, such as smaller than 0.5 mm$^3$, such as smaller than 0.25 mm$^3$, such as smaller than 0.1 mm$^3$.

The total area of the suspension member 48 should be as large as possible, and preferably larger than 0.5 mm$^2$, such as larger than 1 mm$^2$, such as larger than 2 mm$^2$, such as larger than 4 mm$^2$, such as larger than 6 mm$^2$, such as larger than 8 mm$^2$, such as larger than 10 mm$^2$. A large total area is advantageous as this requires a smaller amplitude of the movement of the moveable mass 47 in order to reach certain volume displacement and thereby sensitivity. Moreover, the moveable mass 47 can be shaped and thus maximised, while, at the same time, keeping the surface connection to the suspension member 48 as small as possible. A smaller mass-to-film-area provides larger suspension member gaps 56, which is advantageous in that it ensures a high compliance of the suspension member 48.

Although the invention has been discussed in the foregoing with reference to exemplary embodiments of the invention, the invention is not restricted to these particular embodiments which can be varied in many ways without departing from the invention. The discussed exemplary embodiments shall therefore not be used to construe the appended claims strictly in accordance therewith. On the contrary, the embodiments are merely intended to explain the wording of the appended claims, without intent to limit the claims to these exemplary embodiments. The scope of protection of the invention shall therefore be construed in accordance with the appended claims only, wherein a possible ambiguity in the wording of the claims shall be resolved using these exemplary embodiments.

The invention claimed is:

1. A micro-electromechanical transducer, comprising:
a pressure detection arrangement; and
a sub-assembly adapted to cooperate with the pressure detection arrangement via a coupling volume, said sub-assembly including
one or more moveable masses, and
a suspension member suspending at least one moveable mass of the one or more moveable masses,
wherein the coupling volume is at least partly defined by the suspension member, and wherein the coupling volume is acoustically connected to an interior volume of the pressure detection arrangement;
wherein the suspension member includes a viscoelastic material, the viscoelastic material configured to dampen one or more resonance peaks of the micro-electromechanical transducer and acoustically seal the coupling volume.

2. A micro-electromechanical transducer according to claim 1, wherein the suspension member encircles a support structure secured thereto.

3. A micro-electromechanical transducer according to claim 2, wherein one or more moveable masses is/are secured to the support structure.

4. A micro-electromechanical transducer according to claim 2, wherein the suspension member, in a cross-sectional profile, comprises an inner portion having an inner thickness and an outer portion having an outer thickness, wherein the outer thickness is greater than the inner thickness.

5. A micro-electromechanical transducer according to claim 4, wherein an indentation is formed between the inner and outer portions of the suspension member.

6. A micro-electromechanical transducer according to claim 4, wherein the outer portion of the suspension member is secured to an exterior surface of the pressure detection arrangement.

7. A micro-electromechanical transducer according to claim 1, wherein the suspension member comprises a film of the viscoelastic material suspended between spacer portions.

8. A micro-electromechanical transducer according to claim 7, wherein one or more moveable masses is/are secured to either one surface or both surfaces of the suspended film.

9. A micro-electromechanical transducer according to claim 7, wherein the spacer portions constitute at least part of a peripheral rim of a spacer structure further comprising a central indentation encircled by the peripheral rim.

10. A micro-electromechanical transducer according to claim 9, wherein the spacer structure comprises a ventilation opening aligned with an opening in an exterior surface of the pressure detection arrangement.

11. A micro-electromechanical transducer according to claim 7, wherein the spacer portions form a peripheral spacer secured to, or forming part of, an exterior surface of the pressure detection arrangement.

12. A micro-electromechanical transducer according to claim 11, wherein the exterior surface of the pressure detection arrangement comprises a further opening.

13. A micro-electromechanical transducer according to claim 12, wherein said further opening acoustically connects a back volume of the sub-assembly and a back volume of the pressure detection arrangement.

14. A micro-electromechanical transducer according to claim 1, wherein the sub-assembly further comprises a housing secured to an exterior surface of the pressure detection arrangement, the housing setting outer boundaries of a sub-assembly back volume.

15. A micro-electromechanical transducer according to claim 7, wherein the sub-assembly further comprises a housing secured to an exterior surface of the pressure detection arrangement, the housing setting outer boundaries of a sub-assembly back volume.

16. A micro-electromechanical transducer according to claim 1, wherein the pressure detection arrangement comprises a pressure sensing element and a signal processor for processing electrical signals from the pressure sensing element.

17. A micro-electromechanical transducer according to claim 7, wherein the pressure detection arrangement comprises a pressure sensing element and a signal processor for processing electrical signals from the pressure sensing element.

18. A micro-electromechanical transducer according to claim 1, wherein the viscoelastic material forming the suspension member is selected from a group of thermosetting elastomers having a low Young's modulus and a high viscosity.

19. A micro-electromechanical transducer according to claim 7, wherein the viscoelastic material forming the suspension member is selected from a group of thermosetting elastomers having a low Young's modulus and a high viscosity.

20. A micro-electromechanical transducer according to claim 1, wherein the viscoelastic material forming the suspension member comprises silicone rubber.

21. A micro-electromechanical transducer according to claim 7, wherein the viscoelastic material forming the suspension member comprises silicone rubber.

22. A micro-electromechanical transducer according to claim 1, wherein the pressure detection arrangement comprises a MEMS microphone.

23. A micro-electromechanical transducer according to claim 7, wherein the pressure detection arrangement comprises a MEMS microphone.

24. A hearing device comprising a micro-electromechanical transducer according to claim 1, said hearing device being a hearing aid, a hearable, an earbud or a similar device.

25. A hearing device comprising a micro-electromechanical transducer according to claim 7, said hearing device being a hearing aid, a hearable, an earbud or a similar device.

* * * * *